(12) United States Patent
Visokay et al.

(10) Patent No.: US 7,547,596 B2
(45) Date of Patent: Jun. 16, 2009

(54) METHOD OF ENHANCING DRIVE CURRENT IN A TRANSISTOR

(75) Inventors: Mark R. Visokay, Wappingers Falls, NY (US); Shaofeng Yu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/832,037

(22) Filed: Aug. 1, 2007

(65) Prior Publication Data

US 2009/0032877 A1    Feb. 5, 2009

(51) Int. Cl.
*H01L 21/8238* (2006.01)
(52) U.S. Cl. ............... 438/199; 438/482; 257/E21.632
(58) Field of Classification Search ................ 438/197, 438/199, 230, 301, 303, 482; 257/E21.632
See application file for complete search history.

(56) References Cited

U.S. PATENT DOCUMENTS

| 6,153,485 | A | 11/2000 | Pey et al. |
| 6,174,791 | B1 | 1/2001 | Lin et al. |
| 6,548,361 | B1 * | 4/2003 | En et al. .................. 438/301 |
| 7,183,182 | B2 | 2/2007 | Cabral, Jr. et al. |

OTHER PUBLICATIONS

M. Togo, et al., "Newly Found Anomalous Gate Leakage Current (AGLC) for 65 nm Node and Beyond, and Its Countermeasure Using Nitrogen Implanted Poly-Si" 2006 Symposium on VLSI Technology Digest of Technical Papers.
S. Shimizu, et al., "Impact of Surface Proximity Gettering and Nitrided Oxide Side-Wall Spacer by Nitrogen Implantation on Sub-Quarter Micron CMOS LDD FETs" IEEE 1995, pp. 859-862.
M. Agostinelli, et al., "Erratic Fluctuations of SRAM Cache Vmin at the 90nm Process Technology Node" IEEE 2005.
Yung-Huei Lee, et al., "Prediction of Logic Product Failure Due to Thin-Gate Oxide Breakdown" IEEE 44th Annual International Reliability Physics Symposium, San Jose, 2006, pp. 18-28.
Vinod Ramadurai, et al., "SRAM Operational Voltage Shifts in the Presence of Gate Oxide Defects in 90 nm SOI" 44th Annual International Reliability Physics Symposium, San Jose, 2006, pp. 270-273.

* cited by examiner

*Primary Examiner*—Hoai V Pham
(74) *Attorney, Agent, or Firm*—Frederick J. Telecky, Jr.; Wade J. Brady, III

(57) ABSTRACT

A method of manufacturing a semiconductor device includes forming transistors including gate electrodes and source/drain regions over a substrate. A protective layer is placed over the source/drain regions and the gate electrodes. A portion of the protective layer is removed to expose a portion of the gate electrodes. The exposed portions of the gate electrodes are amorphized, and remaining portions of the protective layer located over the source/drain regions are removed. A stress memorization layer is formed over the gate electrodes, and the substrate is annealed in the presence of the stress memorization layer to at least reduce an amorphous content of the gate electrodes. The stress memorization layer is removed subsequent to the annealing.

17 Claims, 11 Drawing Sheets

METHOD OF ENHANCING DRIVE CURRENT IN A TRANSISTOR

TECHNICAL FIELD OF THE INVENTION

The invention is directed, in general, to forming MOS transistors, and, more specifically, to increasing the drive current of the transistors.

BACKGROUND OF THE INVENTION

Semiconductor devices, such as transistors, have reached well into the sub-micron range, e.g., below 0.25 microns. The semiconductor manufacturing industry has made continued advances in overall device speed and performance, while continually shrinking device size and increasing component density.

Creating strain in channel regions of planar MOS transistors may increase the mobility of charge carriers in the channel region. So-called "strain engineering" seeks to take advantage of this principle to increase the switching speed of the transistors. In general, tensile strain increases the mobility of electrons, while compressive strain increases the mobility of holes.

SUMMARY OF THE INVENTION

The invention provides in one embodiment a method of manufacturing a semiconductor device. Transistors including gate electrodes and source/drain regions are formed over a substrate, and a protective layer is formed over the source/drain regions and the gate electrodes. A portion of the protective layer is removed to expose a portion of the gate electrodes, and the exposed portion is amorphized. Remaining portions of the protective layer located over the source/drain regions are removed. A stress memorization layer is formed over the gate electrodes. The substrate is annealed in the presence of the stress memorization layer to at least reduce an amorphous content of the gate electrodes. The stress memorization layer is removed subsequent to the annealing.

Another embodiment is a method of manufacturing a semiconductor device. Transistors that include gate electrodes and source/drain regions are formed located over a substrate. The transistors are formed by the process of forming a first dielectric layer over the source/drain regions. A second dielectric layer is deposited over the first dielectric layer, and a third dielectric layer is placed over the second dielectric layer. A portion of the third dielectric layer is removed by chemical-mechanical polishing. A portion of the second dielectric layer and a portion of the first dielectric layer are removed to expose a portion of the gate electrodes. A dopant is implanted into the exposed portions, but not into the source/drain regions, the implanting amorphizing the exposed portions. Remaining portions of the first, second and third dielectric layers are removed. A stress memorization layer is formed over the gate electrodes, and comprises a stressed dielectric layer and an oxide layer. The substrate is annealed in the presence of the stress memorization layer to at least reduce an amorphous content of the gate electrodes. The stress memorization layer is removed subsequent to the annealing. A plurality of dielectric layers over the substrate, with horizontal and vertical interconnects therein, are formed connecting the transistors.

Another embodiment is a semiconductor device including a plurality of dielectric layers over a substrate with horizontal and vertical interconnects formed therein. Transistors are located over said substrate and connected by the interconnects. The transistors include gate electrodes and source/drain regions, and are formed by the process of forming a protective layer over the source/drain regions and the gate electrodes. A portion of the protective layer is removed to expose a portion of the gate electrodes. The exposed portion is amorphized. Remaining portions of the protective layer located over the source/drain regions are removed. A stress memorization layer is formed over the gate electrodes. The substrate is annealed in the presence of the stress memorization layer to at least reduce an amorphous content of the gate electrodes. The stress memorization layer is removed subsequent to the annealing.

BRIEF DESCRIPTION OF THE DRAWINGS

For a more complete understanding of the invention, reference is now made to the following descriptions taken in conjunction with the accompanying drawings, in which.

DETAILED DESCRIPTION

Figure 1:
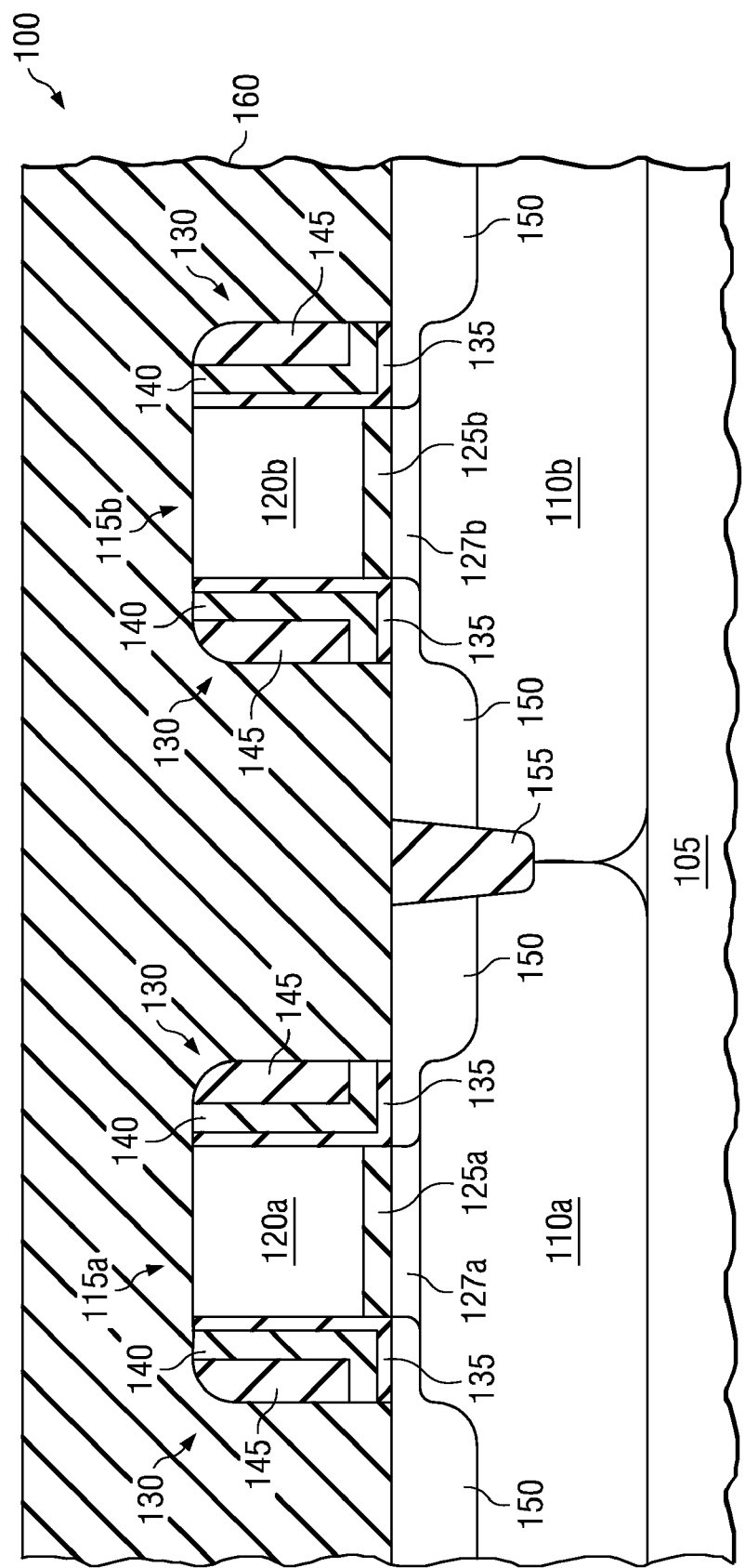
FIGS. 1-10 illustrates MOS transistors at various stages of completion.

One method that has been used to engineer the strain of n-channels and p-channels is the deposition of a stressed dielectric film such as silicon nitride over the transistors. The stress in the film is transferred to the channel region to produce the desired compressive or tensile strain in the channel. However, the magnitude of the strain that may be induced in the channel region is limited.

The gate electrode of a MOS transistor is typically exposed during the implantation of dopants into the source/drain regions. Implanting the source/drain dopant into the gate electrode generally increases the proportion of amorphous material in the gate electrode. This proportion is referred to herein as the "amorphous content" of the gate electrode.

When a gate electrode with amorphous content is annealed in a thermal process, the volume of the gate electrode generally decreases as the amorphous material crystallizes. If a dielectric capping layer is formed over the gate electrode before the annealing, the reduction of volume may result in stress in the gate region that produces lattice strain.

Generally, the greater the amorphous content of the gate electrode prior to annealing, the greater the lattice strain produced in the channel. One approach to increasing the amorphous content might include increasing the energy or dose of a dopant or other species implanted into the gate electrode to increase the amorphous content. But because the source/drain regions are also exposed, such an increase in energy or dose would result in increased dose of the implanted species, increased lattice damage, and/or greater depth of the implanted dopant or damage in the source/drain regions.

Semiconductor manufacturers generally determine precise transistor doping parameters to achieve desired performance of the transistors. When doping is done by implanting a species, the doping parameters, such as dose and energy, and the species used may have a significant effect on the transistor characteristics. Significant changes in the dopant species, implantation energy or dose of the source/drain regions are generally undesirable for reasons including the following: First, implanting an electrically active dopant into the source/drain regions may change the electrical characteristics of the transistor. Second, implanting any dopant, including an electrically neutral dopant, into the source/drain regions increases the chance of forming a dislocation defect in the channel region. Such defects may cause leakage paths in the transistor and reduce final yield of semiconductor devices that include the MOS transistor. As the concentration of implanted dopant atoms in the source/drain regions increases, the density of such defects generally also increases.

Herein, an electrically active implanted species and an electrically neutral implanted species are referred to collectively as a dopant. In some cases, an electrically active dopant is distinguished from an electrically neutral dopant. An electrically active dopant increases a concentration of available charge carriers (electrons or holes) when incorporated into the lattice it is implanted into. In the case of an elemental semiconductor lattice, such as silicon, an electrically active dopant is typically selected from group 13 or group 15 (IUPAC nomenclature) atoms. An electrically neutral dopant does not change the concentration of charge carriers. In the case of an elemental semiconductor, an electrically neutral dopant is typically selected from the same atomic group. Thus, e.g., implanted silicon or germanium is considered an electrically neutral dopant with respect to, e.g., a silicon substrate in this discussion.

The invention includes the recognition that if the process of implanting dopants in the source/drain regions is decoupled from the process of implanting dopants in the gate electrodes, then the process conditions associated with each implantation process may be independent of each other. In other words, a gate electrode implant process may have a different species, energy and dose than does a source/drain implant process. Thus, the gate electrode implant process conditions may be chosen to increase the amorphous content of the gate electrodes without producing dislocations and leakage, e.g., in the source/drain regions.

FIG. 1 illustrates a semiconductor device 100. The device 100 is formed on a substrate 105. Located within the substrate 105 is a p-well region 110a and an n-well region 110b. Located over the substrate 105 and well regions 110a, 110b are an nMOS transistor 115a and a pMOS transistor 115b. Each transistor 115a, 115b includes a gate electrode 120a, 120b and a gate dielectric 125a, 125b. Sidewall spacers 130 include an oxide spacing layer 135, a nitride spacer 140 and an oxide spacer 145. The sidewall spacers 130 partially block implantation of a dopant into source/drain regions 150. An isolation trench 155 separates the source/drain region of the nMOS transistor 115a and the source/drain region of the pMOS transistor 115b. A dielectric layer 160 overlies the transistors 115a, 115b and serves to space the transistors from overlying interconnect levels (not shown).

The transistors 115a, 115b include strained channel regions 127a, 127b formed by an embodiment of the invention described herein. In particular, one or both of the channel regions 127a, 127b is strained by stress produced by a reduction of volume of the gate electrodes 120a, 120b after implanting a dopant into the gate electrodes 120a, 120b but not the source/drain regions 150. The source/drain regions 150 are protected from the implanting by a protective layer, as described below.

Figure 2:
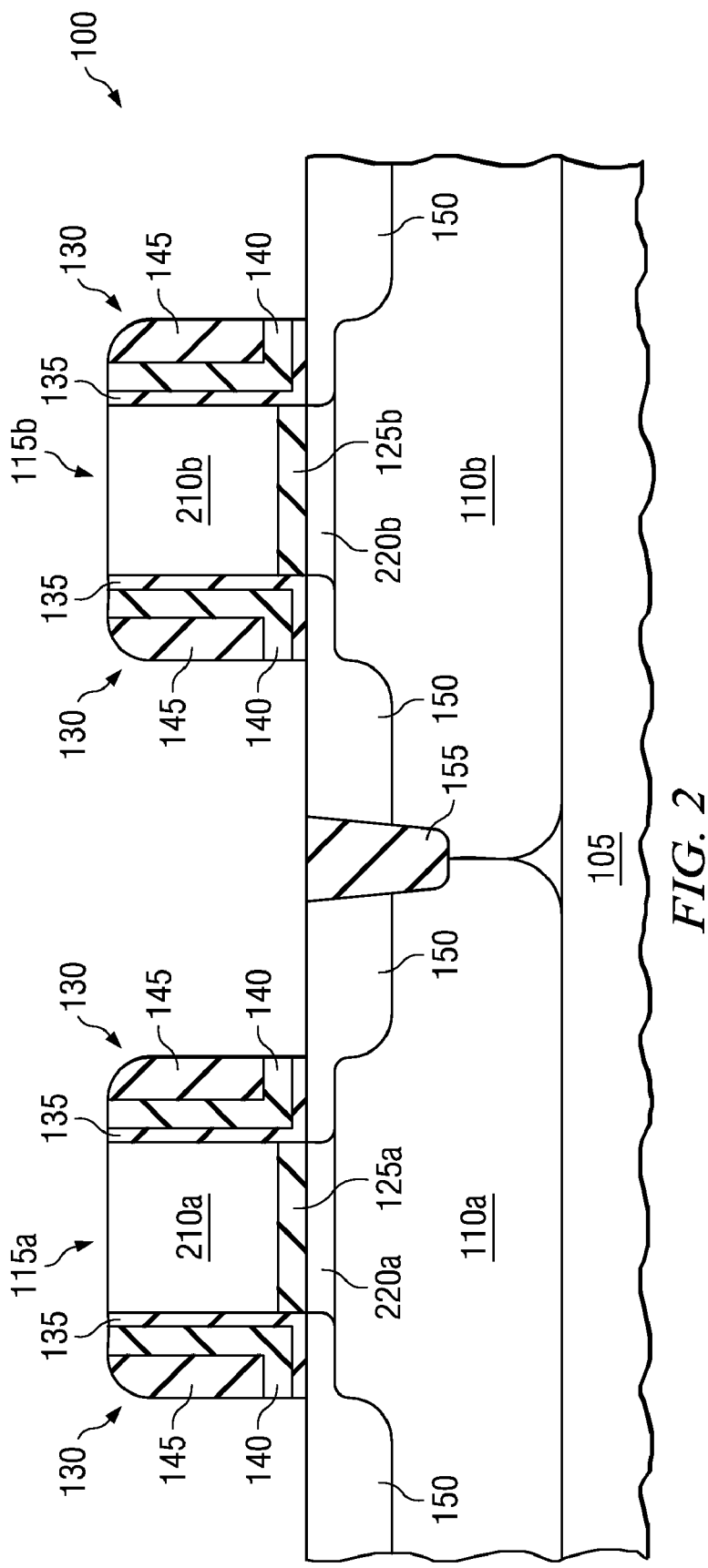

FIG. 2 illustrates the device 100 prior to formation of the protective layer. At the illustrated stage of manufacturing, the device 100 includes as-formed gate electrodes 210a, 210b and unstrained channel regions 220a, 220b. The as-formed electrodes 210a, 210b may be formed of a polycrystalline semiconductor layer such as polysilicon. In the illustrated embodiment, source/drain dopants have already been implanted into the source/drain regions 150. In some embodiments, the dopants in the source/drain regions 150 are also thermally activated prior to the formation of the protective layer. In another embodiment, not illustrated, source/drain dopants are implanted into the source/drain regions 150 after implanting a dopant into the as-formed electrodes 210a, 210b to increase the amorphous content thereof, as described below.

Figure 3:
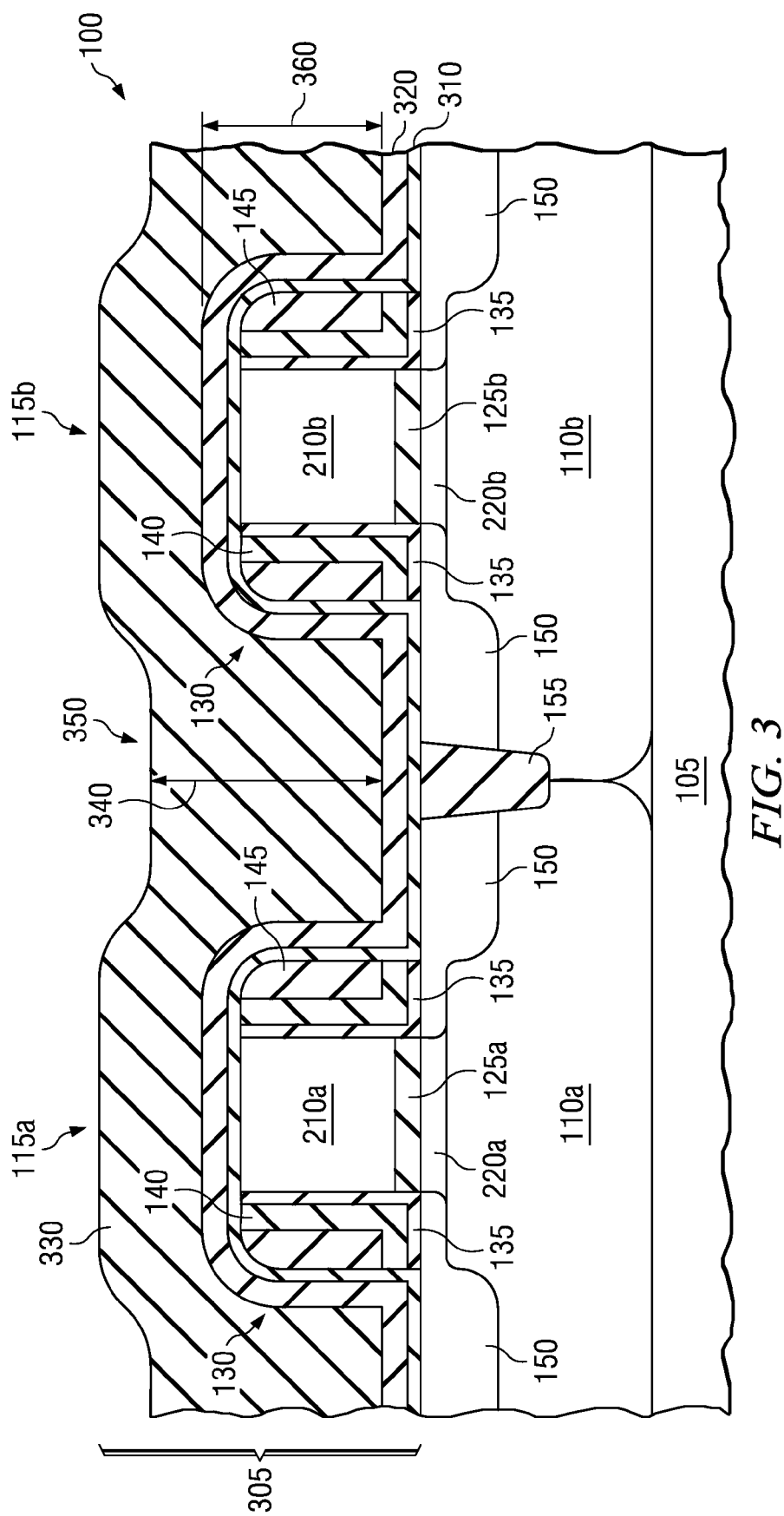

FIG. 3 illustrates the device 100 after formation of a protective layer 305 over the as-formed electrodes 210a, 210b and the source/drain regions 150. Dopants in the source/drain regions 150 may optionally be activated prior to the formation of the protective layer 305. The protective layer 305 includes a first dielectric layer 310, a second dielectric layer 320, and a third dielectric layer 330. The first dielectric layer 310 is characterized by having a lower rate of removal than the second dielectric layer 320 by a wet chemical etch or plasma etch process. Thus, at a later stage of manufacturing, the second dielectric layer 320 may be removed using the first dielectric layer 310 as a stopping layer.

Without limitation, the first dielectric layer 310 may be a plasma silicon oxide layer and the second dielectric layer 320 may be a plasma CVD silicon nitride layer. Other materials that may be used as a stopping layer under silicon nitride include, e.g., silicon oxynitride and silicon carbide. The thicknesses of the first dielectric layer 310 and the second dielectric layer 320 will in general depend on each other and on the relative removal rate of the layers by the chosen removal process. The second dielectric layer 320, as described below, is sufficiently thick that it is not completely removed by a planarization step at a later stage of manufacturing.

A portion of the third dielectric layer 330 will be removed at a later stage of manufacturing using a planarization process such as chemical-mechanical polishing (CMP). The third dielectric layer 330 is characterized by having a greater rate of removal by the planarization process than the second dielectric layer 320. Thus, the second dielectric layer 320 may act as a stopping layer for the planarization process. The thickness of the third dielectric layer 330 is sufficient that a height 340 of low spots 350 is greater than a height 360 of the as-formed electrodes 210a, 210b plus the thickness of the first dielectric layer 310 and the second dielectric layer 320. This relationship of thicknesses facilitates planarization of the third dielectric layer 330 to remove low spots 350 while ensuring that the planarization process stops in the second dielectric layer.

In general, the thicknesses of the layers 310, 320, 330 will be selected taking into account transistor density in the semiconductor device, cross-wafer uniformity, polish uniformity and etch uniformity. In a nonlimiting example, the thickness of the as-formed electrodes 210a, 210b is about 120 nm, the first dielectric layer 310 and the third dielectric layer 330 comprise silicon oxide, and the second dielectric layer 320 comprises silicon nitride. In this case, the thickness of the first dielectric layer 310 may range from about 4 nm to about 75 nm, the thickness of the second dielectric layer 320 may range from about 6 nm to about 20 nm, and the thickness of the third dielectric layer 330 may range from about 200 nm to about 1.5 μm. One skilled in the semiconductor arts may determine appropriate thicknesses taking into account the aforementioned factors.

Figure 4:
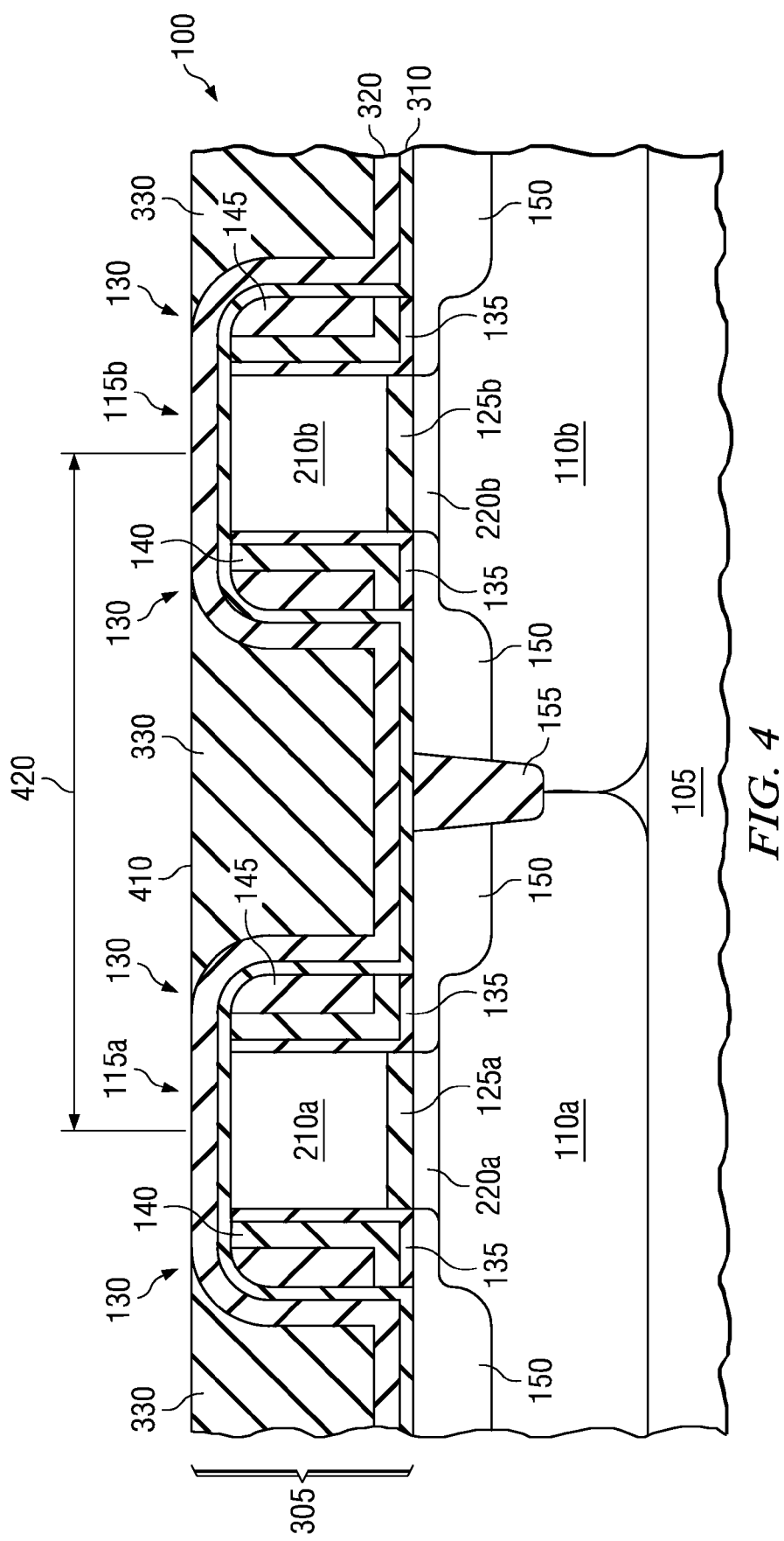

FIG. 4 illustrates the device 100 after the third dielectric layer 330 has been planarized, by, e.g., CMP. Polishing process parameters may in general depend on the process tool used, the chosen polishing slurry, and the configuration of areas of dense and sparse transistor placement on the device 100. Those skilled in the art of semiconductor manufacturing are able to determine suitable process parameters considering these factors.

In a preferred embodiment, the thickness of the second dielectric layer 320 and third dielectric layer 330 are chosen to ensure that a portion of the second dielectric layer 320 remains over the as-formed electrodes 210a, 210b at all locations on the substrate 105 after planarization. In some cases, the removal rate of the third dielectric layer 330 is at least ten times greater than the removal rate of the second dielectric layer 320. Such a difference in removal rate may reduce the required thickness of the third dielectric layer 330 necessary to ensure that a portion of the second dielectric layer 320 remains.

After the planarization process, a surface 410 of the third dielectric layer 330 is substantially planar. By substantially planar, it is meant that the vertical height of the surface 410 over the substrate 105 varies by less than about 10% of the height of the as-formed electrodes 210a, 210b over the scale of a minimum spacing 420 between transistors formed on the substrate 105. Preferably, such variation is less than 5% of the electrode height, and more preferably is less than about 1%.

Figure 5:
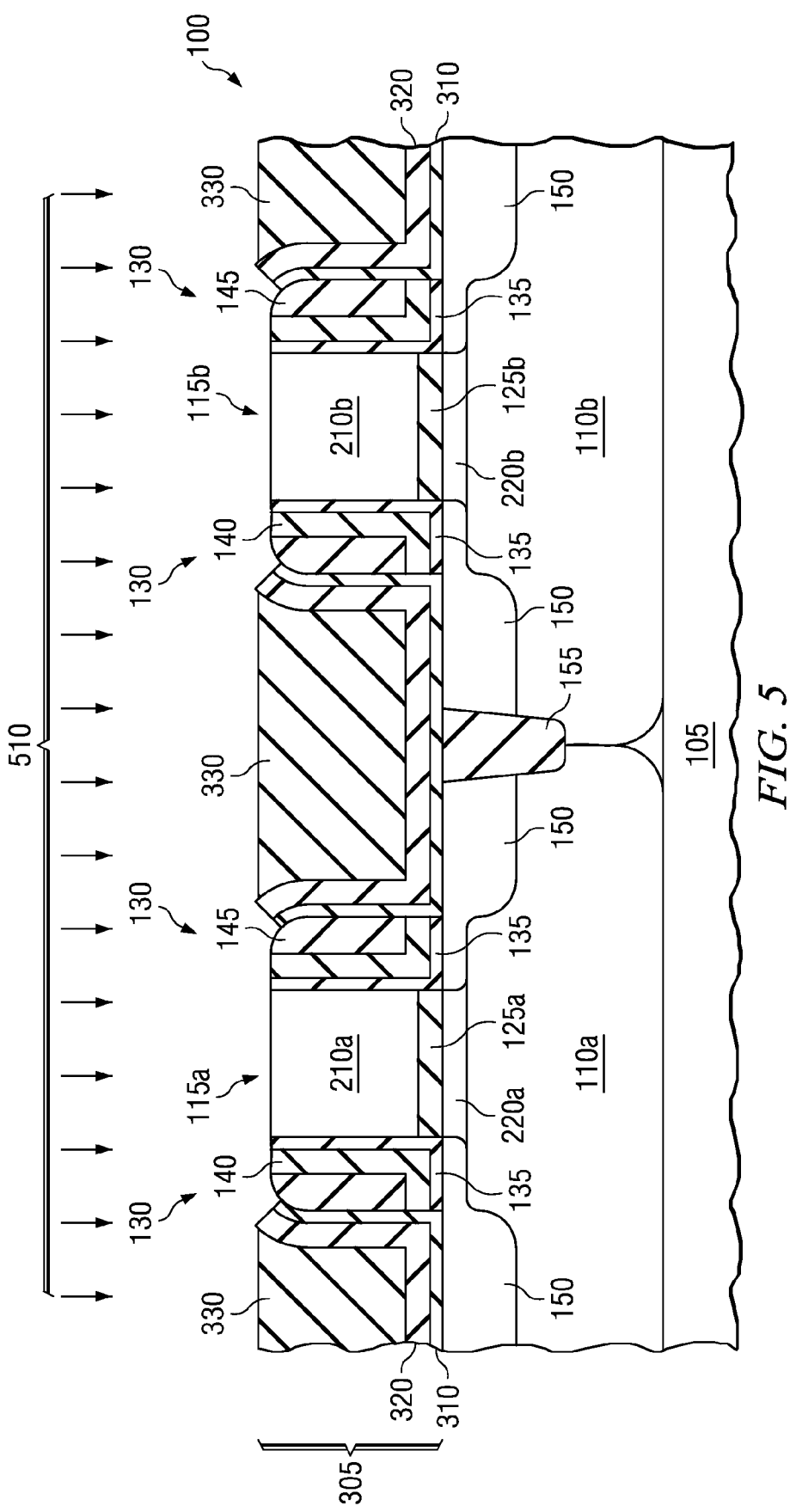

FIG. 5 illustrates the device 100 after removing a portion of the second dielectric layer 320 and the first dielectric layer 310 overlying the as-formed electrodes 210a, 210b. Such removal may be performed, e.g., by a plasma etch 510. The plasma etch 510 may be have multiple etch steps, with different steps designed to remove each dielectric layer.

Optionally, the multiple steps may be performed in a single etch chamber without a vacuum break.

When multiple etch steps are used, an earlier step of the plasma etch 510 is designed to remove the second dielectric layer 320 at a greater rate than the first dielectric layer 310. In some cases the removal rate may be ten times greater, and may be more than twenty times greater. In a preferred embodiment, the thickness of the first dielectric layer 310 is chosen to ensure that a portion thereof remains over the electrodes 210a, 210b at all locations of the substrate 105 after the earlier etch step is completed.

A later step of the etch process 510 is designed to remove the first dielectric layer 310 at a rate greater than the as-formed electrodes 210a, 210b. To minimize removal of the electrode material, the later step may be designed to remove the dielectric layer 310 at a rate at least twenty times the removal rate of electrode material. In some cases, the removal rate of the dielectric layer 310 may be at least 50 times greater.

A plasma etch process typically includes a period of overetch to ensure complete removal of the layer being removed. The duration of the overetch period is generally greater for a thicker layer, and lesser for a thinner layer. To minimize the removal of electrode 210a, 210b material, in a preferred embodiment the thickness of the first dielectric layer 310 is chosen to minimize the duration of the overetch. However, it is also preferable that the thickness of the first dielectric layer 310 be sufficient to ensure that a portion remains in all locations of the substrate 105 after the portion of the second dielectric layer 320 is removed by the earlier step of the etch process 510. The selection of layer thicknesses will in general depend in part on the selectivity of the etch processes employed, and may be determined by one skilled in the art. As a nonlimiting example, the first dielectric layer 310 may be about 10 nm when the selectivity of the etch process 510 is about 10:1 or greater.

Figure 6:
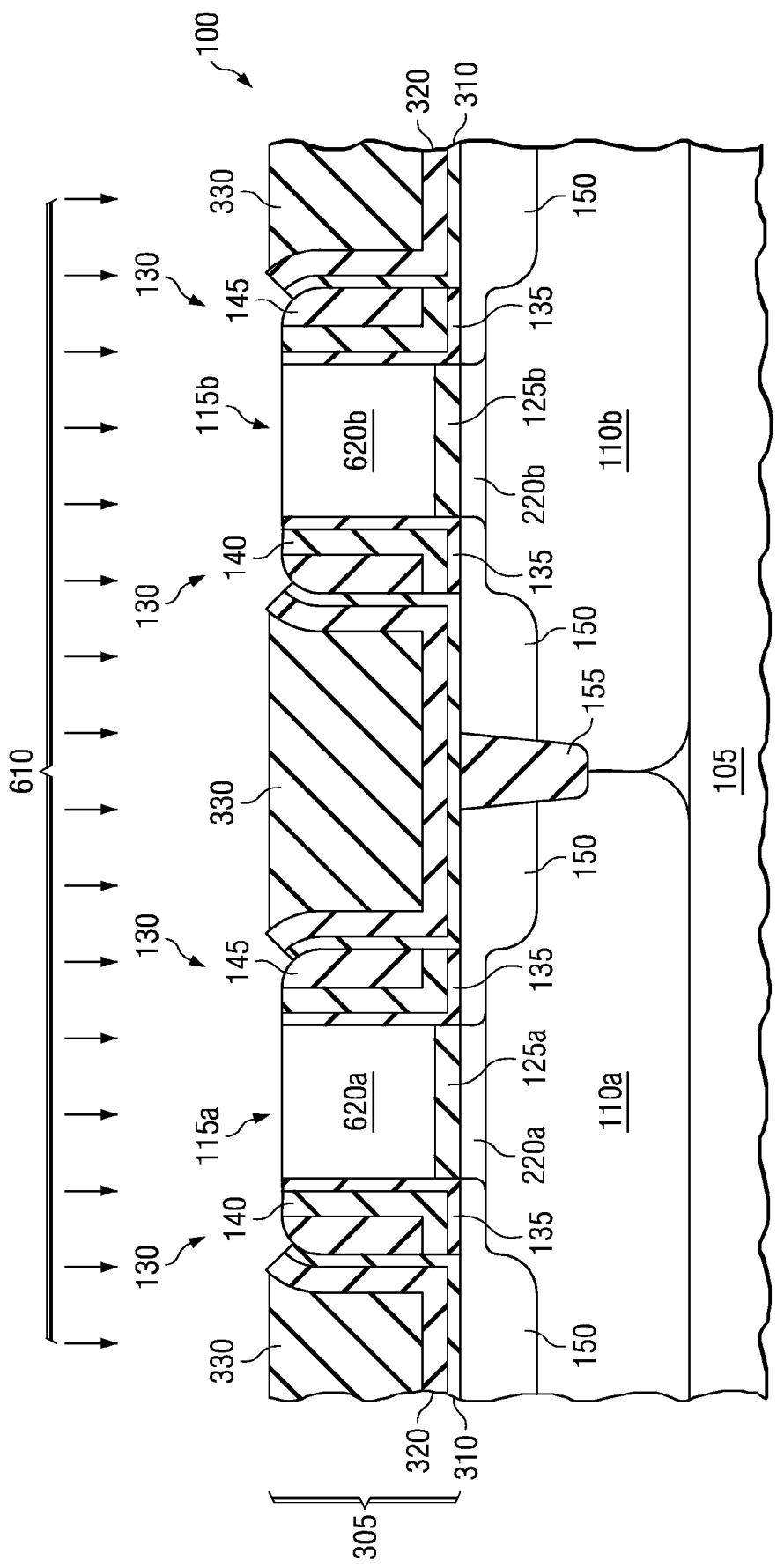

In FIG. 6, an implant process 610 is illustrated implanting a dopant into the as-formed electrodes 210a, 210b to form amorphized electrodes 620a, 620b. Because the electrodes 210a, 210b are exposed to the implant process 610 while the source/drain regions 150 remain protected by the protective layer 305, the dopant is implanted into the as-formed electrodes 210a, 210b, but not the source/drain regions 150. Thus, the doping of the as-formed electrodes 210a, 210b and the source/drain regions 150 is decoupled, allowing greater flexibility of the doping level of the amorphized electrodes 620a, 620b.

In one aspect, the dopant is an implanted dopant capable of amorphizing the as-formed electrodes 210a, 210b. As used herein, amorphizing means that the degree to which the crystal lattice departs from an ideal lattice structure is increased. The use of the term recognizes that the as-formed electrodes 210a, 210b may already depart from ideality before the dopant is implanted.

In some cases, the dopant is from the same atomic group as the as-formed electrode 210a, 210b material. For example, when the as-formed electrodes 210a, 210b include silicon, the dopant may be silicon or germanium. In some cases, the dopant is a dopant used to form the source/drain regions of the transistors 115a, 115b. Thus, for example, an n-type dopant such as arsenic or phosphorous may be used to dope the as-formed electrode 210a, and boron may be used to dope the as-formed electrode 210b. If different dopants are used to dope the as-formed electrode 210a and the as-formed electrode 210b, then conventional masking techniques may be used to protect each electrode in turn from the dopant implanted into the other electrode.

In one aspect, the implant process 610 is designed to amorphize the as-formed electrodes 210a, 210b. Process parameters such as implant dose, implant energy, angle, and a combination of these may be selected to result in the desired amorphous content. The implant parameters may be selected to result in an amorphous content determined to result in a desired increase in drive current of the completed transistor 115a, 115b. In one nonlimiting example, As is used as the dopant using an implant energy of about 30 keV and a dose of about 2E15 $cm^{-2}$.

In another aspect, more than one dopant may be implanted into the as-formed electrodes 210a, 210b. In one embodiment, an electrically neutral dopant such as silicon or germanium and an electrically active dopant are implanted into the as-formed electrodes 210a, 210b. Such a scheme may be desirable, e.g., to result in a desired amorphous content and a desired resistivity of the gate electrodes 120a, 120b after completion of the transistors 115a, 115b.

In another aspect, the energy or dose with which the dopant is implanted is selected to place a maximum increase of amorphous content of the as-formed electrodes 210a, 210b at a desired depth below the surface thereof. In an embodiment, one or more implants are used to result in a desired profile of amorphous content of the amorphized electrodes 620a, 620b. For example, an implant with a relatively higher implant energy may be used to increase the amorphous content of the as-formed electrodes 210a, 210b at a greater depth below the surface, and a relatively lower implant energy may be used to increase the amorphous content of the as-formed electrodes 210a, 210b at a lesser depth below the surface. In this way, a profile of amorphous content may be produced that results in a desired strain in the channel regions 220a, 220b when fabrication of the transistors 115a, 115b is complete.

Figure 7:
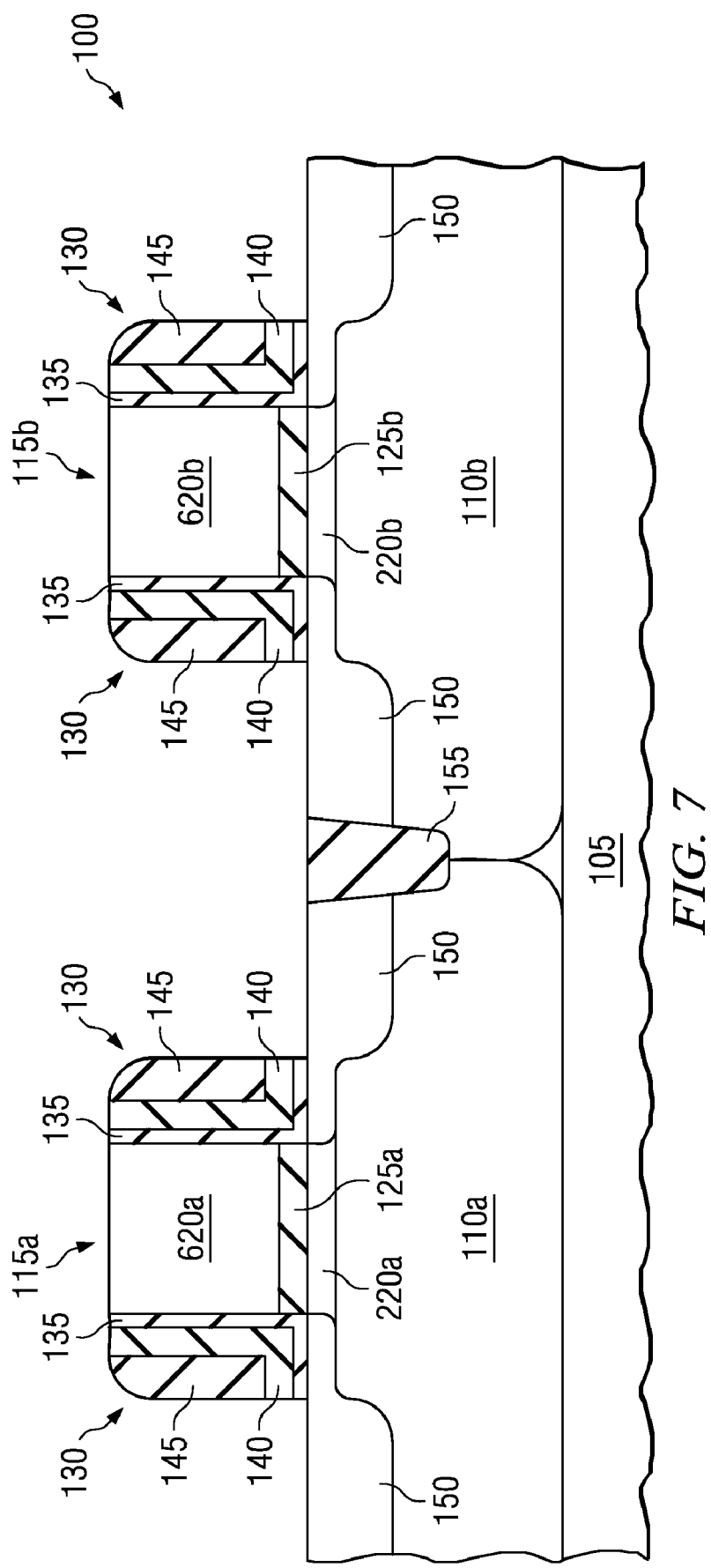

FIG. 7 illustrates the device 100 after remaining portions of the first dielectric layer 310, second dielectric layer 320 and the third dielectric layer 330 have been removed. The removal of each layer may be performed by wet chemical etch or plasma etch, as appropriate to layer material, the overall device integration scheme and availability of manufacturing resources. In one aspect, each layer is removed using a process that is selective to the underlying layer to provide a stopping point for the removal of the overlying layer. In a preferred embodiment, the selectivity of the process removing the overlying layer has a selectivity to the underlying layer greater than 10:1.

Figure 8:
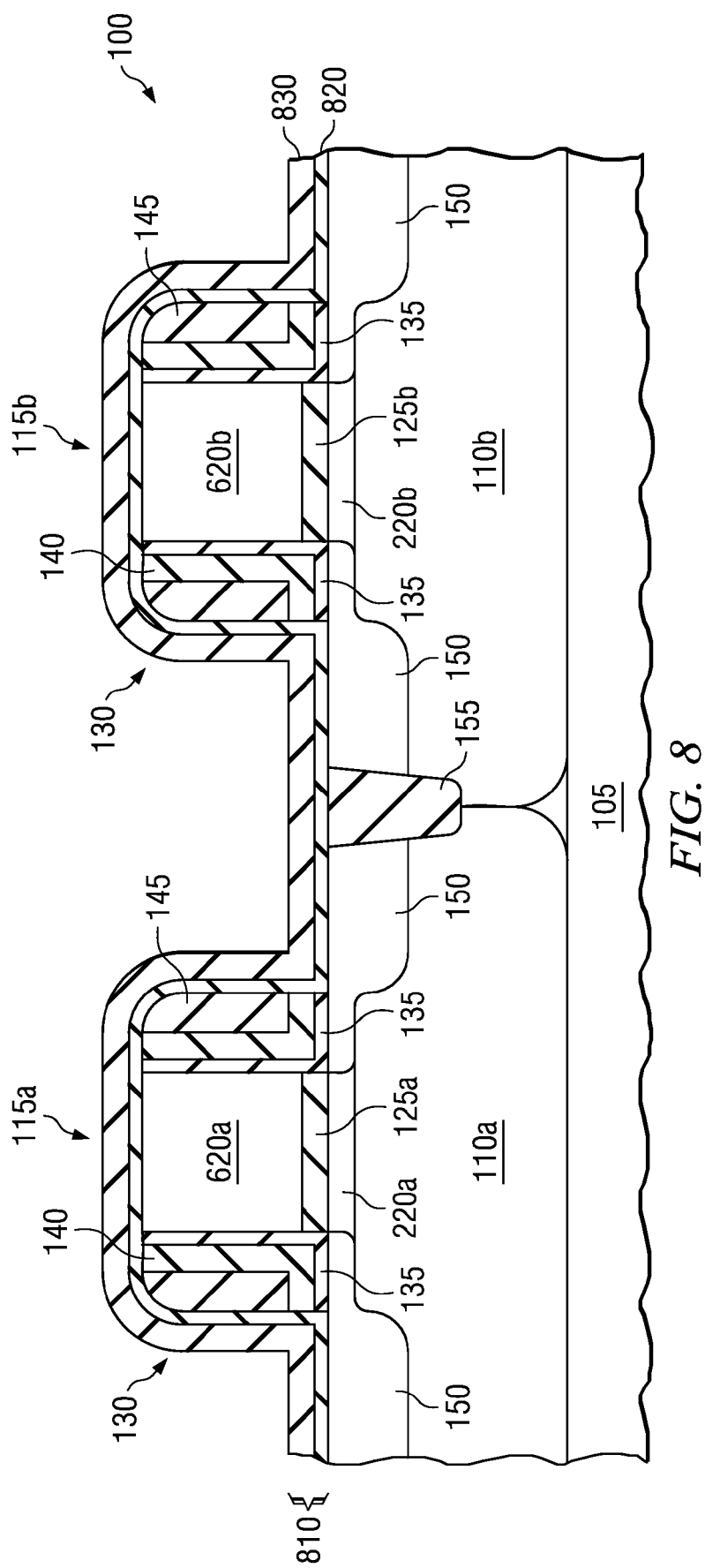

FIG. 8 illustrates an embodiment in which a stress memorization layer 810 has been formed over the amorphized electrodes 620a, 620b. The stress memorization layer 810 is illustrated including a stopping layer 820 and a stressed layer 830, but the invention is not so limited. The stress memorization layer 810 may be any material or materials that may be formed and removed in a manner compatible with further processing of the device 100. In general, the stress memorization layer 810 is formed with a thickness and stress value that results in the desired lattice strain in the channel regions 220a, 220b when the amorphized electrodes 620a, 620b are annealed at a later stage of manufacturing.

In a preferred embodiment, the stressed layer 830 comprises plasma silicon nitride. Plasma silicon nitride films may be formed with a range of stress values including compressive and tensile. In a non-limiting example, a silicon nitride layer with a thickness of about 20 nm and a tensile stress of about 200 MPa will result in the desired formation of strain in the channel regions 210a, 210b during the recrystallization process. In an embodiment, the stopping layer 820 comprises plasma silicon oxide. Well-known etch processes are available to remove silicon nitride with selectivity to silicon oxide. Thus, use of silicon oxide may facilitate the removal of the stressed layer 830 at a later stage of manufacturing, if such removal is desired.

Figure 9:
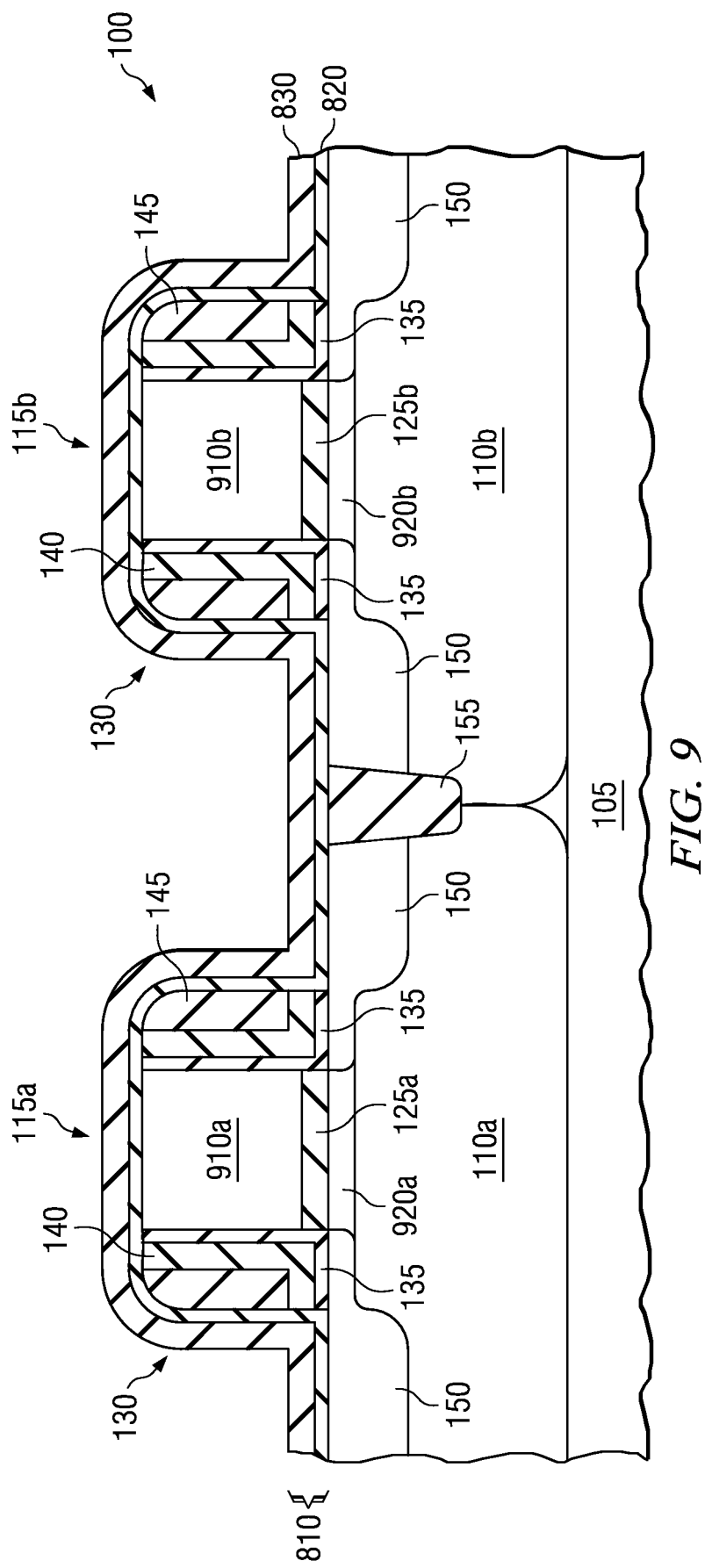

FIG. 9 illustrates the device 100 after a thermal process that at least partially anneals the amorphized electrodes 620a, 620b, thereby forming annealed electrodes 910a, 910b. When the amorphized electrodes 620a, 620b are annealed, it is believed that crystallization results in a reduction of volume thereof. Without limitation by theory, it is believed that the presence of the stress memorization layer 810 transmits stress to the channel regions 210a, 210b to produce the desired lattice strain. The thermal process may be a process intended to thermally activate dopants in the source/drain regions 150, but is not limited to this case. It is further believed that kinetics of relaxation of the lattice strain are sufficiently slow that the induced strain is effectively permanent over the operating life of the device 100.

Because tensile strain may reduce the mobility of holes, the presence of tensile strain in channel region 920b may increase the switching time of the PMOS transistor 115b. This result may be avoided, in one embodiment, by masking the as-deposited electrode 210b during the etch process 510 to prevent the removal of the first dielectric layer 310 and the second dielectric layer 320 over the pMOS transistor 115b. Thus, the dopant is implanted only into gate electrodes of NMOS transistors by the implant process 610. However, in cases in which a device 100 design is relatively insensitive to increased switching time in the pMOS transistor 115b, it may be acceptable to take no action to prevent the implanting of dopants into the as-deposited electrode 210b.

Figure 10:
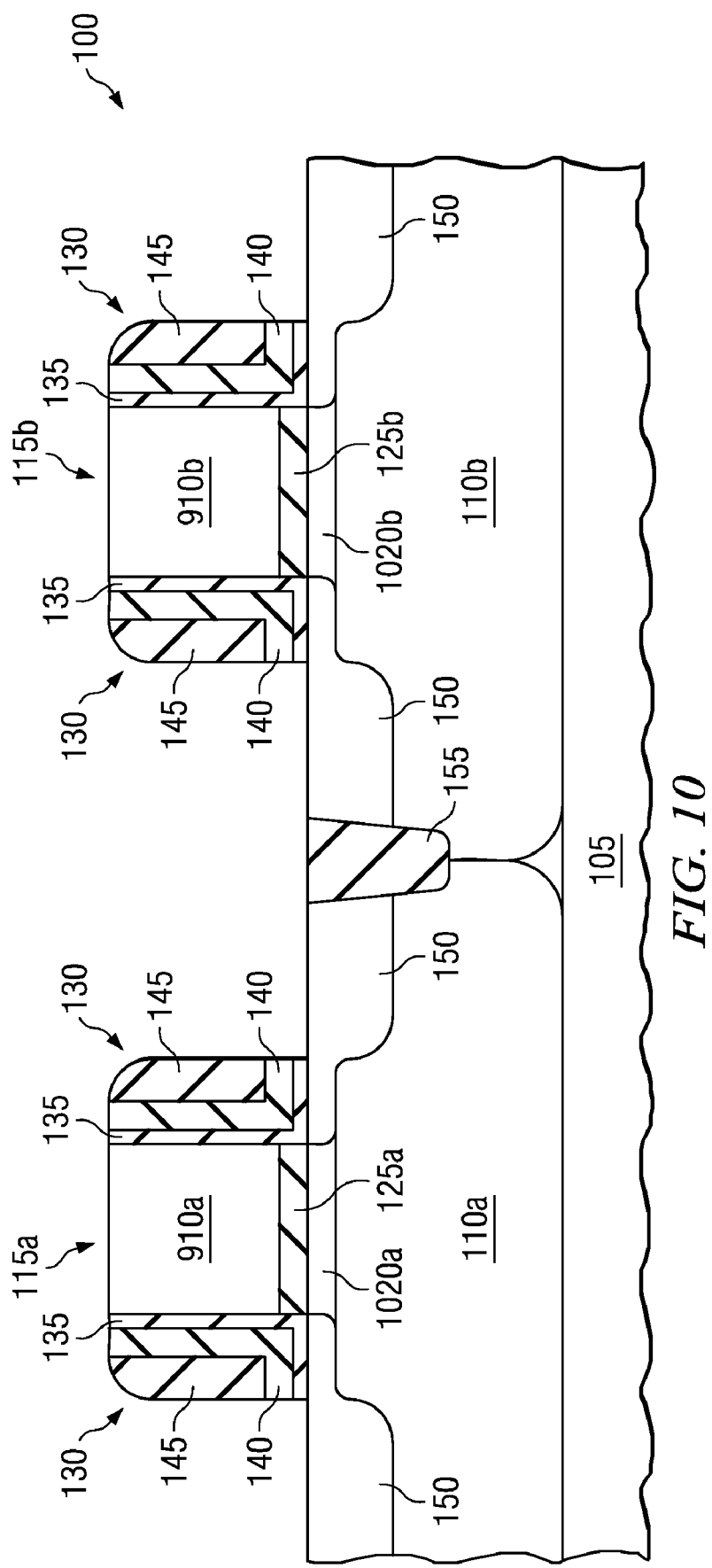

FIG. 10 illustrates the device 100 after removal of the stress memorization layer 810. Removal of this layer may be necessary when a silicide layer is formed over the source/drain regions 150 at a later stage of manufacturing. In cases in which silicidation is not needed, removal of the stress memorization layer 810 may be optional. Such removal may be by wet chemical or plasma processing as determined by process compatibility and manufacturing resources. When the stress memorization layer 810 includes a stopping layer 820, the removal process may include a first removing step selective to the stopping layer 820, and a second removing step to remove the stopping layer 820. When removal of the stress memorization layer 810 is not required for silicidation purposes, the removal may still be desirable to simplify later formation of vertical interconnects (contacts) through the dielectric layer 160 formed at a later stage of manufacturing.

Figure 11:
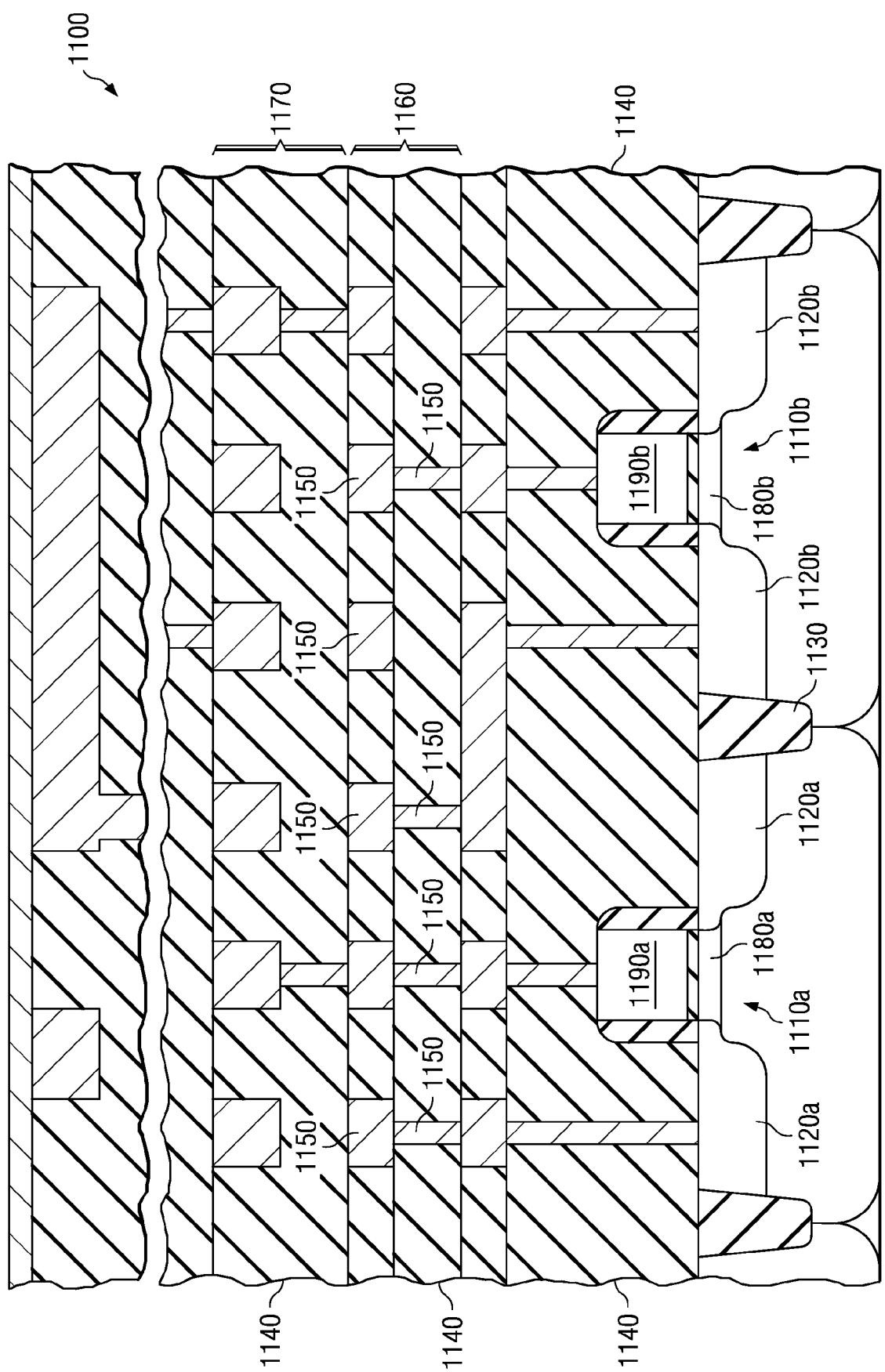
FIG. 11 illustrates a semiconductor device.

FIG. 11 illustrates a sectional view of a semiconductor device 1100 formed according to the invention. The device 1100 includes an nMOS transistor 1110a and a pMOS transistor 1110b. The transistors 1110a, 1110b include source/drain regions 1120a, 1120b and are isolated by isolation structures 1130. Dielectric layers 1140 are formed over the transistors 1110a, 1110b, and interconnects 1150 are formed therein. The interconnects 1150 may be formed using a single damascene 1160 or a dual damascene 1170 architecture. The interconnects 1150 are configured to connect the transistors to other circuit components, including other transistors operating at a same or different voltage supply or gate voltage. Other circuit components may include, without limitation, MOS or bipolar transistors, optical devices and interconnects, diodes, and capacitors. The device 1100 may include any number of interconnect levels determined by the design of the device 1100.

The transistors 1110a, 1110b are formed according to the invention described herein. In particular, the transistors include strained channel regions 1180a, 1180b formed by a method that includes forming annealed gate electrodes 1190a, 1190b by increasing an amorphous content of as-formed gate electrodes, forming a stress memorization layer over the as-formed gate electrodes, and annealing the amorphized gate electrodes. In some embodiments, only the nMOS transistor 1110a is formed by the method described. In other embodiments, the device 1100 may include other NMOS and pMOS transistors that have been formed by a method that does not include increasing the stress of the channel regions of those other transistors.

Those skilled in the art to which the invention relates will appreciate that other and further additions, deletions, substitutions and modifications may be made to the described embodiments without departing from the scope of the invention.

What is claimed is:

1. A method of manufacturing a semiconductor device, comprising:
   forming transistors over a substrate, said transistors comprising gate electrodes and source/drain regions;
   forming a protective layer over said source/drain regions and said gate electrodes;
   removing a portion of said protective layer to expose a portion of said gate electrodes;
   amorphizing said exposed portion;
   removing remaining portions of said protective layer located over said source/drain regions;
   forming a stress memorization layer over said gate electrodes;
   annealing said substrate in the presence of said stress memorization layer to at least reduce an amorphous content of said gate electrodes; and
   removing said stress memorization layer subsequent to said annealing.

2. The method recited in claim 1, wherein a portion of said protective layer remains over said source/drain regions when said exposed regions are amorphized.

3. The method recited in claim 2, wherein said dopant is implanted only into gate electrodes of nMOS transistors.

4. The method recited in claim 1, wherein said exposed portion is amorphized by implanting a dopant therein.

5. The method recited in claim 4, wherein said dopant is electrically neutral.

6. The method recited in claim 4, wherein said transistors include nMOS and pMOS transistors, and an n-type dopant is implanted into gate electrodes of nMOS transistors, and an p-type dopant is implanted into gate electrodes of pMOS transistors.

7. The method recited in claim 4, wherein said source/drain regions are formed using said dopant.

8. The method recited in claim 1, wherein said portion of said protective layer is removed by chemical-mechanical polishing.

9. The method recited in claim 8, wherein removing said portion of said protective layer includes removing all of a first dielectric material layer and at least a portion of a second dielectric material layer over said gate electrodes.

10. The method recited in claim 1, wherein a surface of said exposed portion and a surface of a remaining portion of said protective layer form a substantially planar surface.

11. The method recited in claim 1, wherein said annealing activates dopants in said source/drain regions.

12. The method recited in claim 1, wherein said protective layer comprises an oxide layer formed over a nitride layer.

13. A method of manufacturing a semiconductor device, comprising:

forming transistors located over a substrate, said transistors comprising gate electrodes and source/drain regions and formed by the process of:

forming a first dielectric layer over said source/drain regions;

depositing a second dielectric layer over said first dielectric layer;

placing a third dielectric layer over said second dielectric layer;

removing a portion of said third dielectric layer by chemical-mechanical polishing;

removing a portion of said second dielectric layer and a portion of said first dielectric layer to expose a portion of said gate electrodes;

implanting a dopant into said exposed portions but not into said source/drain regions, said implanting amorphizing said exposed portions;

removing remaining portions of said first, second and third dielectric layers;

forming a stress memorization layer over said gate electrodes comprising a stressed dielectric layer and an oxide layer;

annealing said substrate in the presence of said stress memorization layer to at least reduce an amorphous content of said gate electrodes; and removing said stress memorization layer subsequent to said annealing; and forming a plurality of dielectric layers over said substrate with horizontal and vertical interconnects therein connecting said transistors.

14. The method recited in claim 13, wherein said dopant is electrically neutral.

15. The method recited in claim 13, wherein said transistors include nMOS and pMOS transistors, and an n-type dopant is implanted into gate electrodes of nMOS transistors, and an p-type dopant is implanted into gate electrodes of PMOS transistors.

16. The method recited in claim 13, wherein said dopant is implanted only into gate electrodes of nMOS transistors.

17. The method recited in claim 13, wherein said source/drain regions are formed using said dopant.

* * * * *